United States Patent [19]

Inoue et al.

[11] Patent Number: 5,071,791
[45] Date of Patent: Dec. 10, 1991

[54] METHOD FOR FORMING METAL LAYER

[75] Inventors: Minoru Inoue; Kouzi Hashizume, both of Kawasaki, Japan

[73] Assignee: Fujitsu Limited, Kawasaki, Japan

[21] Appl. No.: 652,484

[22] Filed: Feb. 8, 1991

Related U.S. Application Data

[63] Continuation of Ser. No. 549,649, Jul. 6, 1990, abandoned, which is a continuation of Ser. No. 430,943, Nov. 3, 1989, abandoned, which is a continuation of Ser. No. 282,823, Dec. 8, 1988, abandoned, which is a continuation of Ser. No. 137,578, Dec. 24, 1987, abandoned.

[30] Foreign Application Priority Data

Dec. 25, 1986 [JP] Japan ................................. 61-307979

[51] Int. Cl.$^5$ ..................... H01L 21/443; C23C 14/34
[52] U.S. Cl. ............................... 437/203; 204/192.15; 204/192.16; 204/192.17
[58] Field of Search ...................... 204/192.15, 192.16, 204/192.17; 437/197-199, 203

[56] References Cited

U.S. PATENT DOCUMENTS 3,620,837 11/1971 Leff et al. ............................. 437/187
4,721,689 1/1988 Chaloux, Jr. et al. ............... 437/189

FOREIGN PATENT DOCUMENTS 61-87324 5/1986 Japan ................................... 437/199

OTHER PUBLICATIONS

Solid State Technology, vol. 22, No. 12, Dec. 1979, "Aluminum and Aluminum Alloy Sputter Deposition of VLSI", Hartsough et al., pp. 66–72.

Primary Examiner—Aaron Weisstuch
Attorney, Agent, or Firm—Staas & Halsey

[57] ABSTRACT

A method for forming a metal layer includes the steps of forming an insulation layer having at least one step portion on a wafer; and forming the metal layer over the insulation layer. The metal layer is formed by depositing aluminum-based alloy by sputtering while the wafer is heated to a temperature higher than a predetermined temperature. As a result, at the step portion, a good step coverage can be obtained and the surface of the metal layer can be planarized. At the same time, the method according to the present invention contributes to a prevention of deterioration in the quality of the layer and facilitates a process to be carried out at a later stage.

4 Claims, 5 Drawing Sheets ( AT HEATER TEMPERATURE
OF APPROXIMATELY 600°C )

(IN CASE OF NO HEATING)

(IN CASE OF HEATING, AT HEATER TEMPERATURE OF APPROXIMATELY 200°C)

(AT HEATER TEMPERATURE OF APPROXIMATELY 400°C)

(AT HEATER TEMPERATURE OF APPROXIMATELY 600°C)

METHOD FOR FORMING METAL LAYER

This application is a continuation of application Ser. No. 07/549,649, filed Jul. 6, 1990, now abandoned, which is a continuation of Ser. No. 07/430,943, filed Nov. 3, 1989, abandoned; which is a continuation of Ser. No. 07/282,823, filed Dec. 8, 1988, abandoned; which is a continuation of Ser. No. 07/137,578, filed Dec. 24, 1987, also abandoned.

BACKGROUND OF THE INVENTION

1. Field of the Invention

The present invention relates to a technique for forming a metal layer and, more particularly, to a method for forming a metal layer by depositing aluminum (Al)-based alloy on a wafer by sputtering, and a semiconductor device formed by using that method.

The metal layer forming technique according to the present invention can be widely used in the process of forming an electrical wiring for an integrated circuit (IC) or a large scale integration (LSI).

2. Description of the Related Art

Conventionally, an Al or in Al-based alloy such as Al-1% by weight of silicon (Si), Al-2% by weight of copper (Cu), Al-1% by weight of Si-0.5% by weight of Cu, Al-1% by weight of Si-0.1% by weight of titanium (Ti), and the like, are employed as the wiring materials for LSI's, since such alloys contribute to a decrease in the power dissipation, due to the low resistance thereof. The wiring layers using these alloys are usually formed by sputtering. Further, recent trends toward a higher integration and higher density of a semiconductor device, have led to the formation of a very steep step portion of a layer on which an Al wiring layer is formed. Therefore, considering, for example, a contact hole in the device, the ratio of the step height thereof to the width of the holes thereof is great. Accordingly, it is difficult to form an Al wiring layer having a good step coverage, i.e., a satisfactory degree of thickness, conforming to the shape of a layer thereunder.

A known technique of piling a plurality of Al wiring layers as a multiple layer stack provides a higher integration and higher density device. In this case, however, a problem arises in that, if the step coverage of an Al wiring layer is not good, an adverse influence is exerted upon the step coverage of an insulation layer to be formed thereupon and, furthermore, this adverse influence is extended to the step coverage of another Al wiring layer to be formed thereon, and thus it is difficult to obtain a multiple-layer wiring construction having a good shape.

To cope with this problem, a metal layer must be deposited to obtain a planarized shape, particularly at a steep step portion, and thus obtain a good step coverage in the step portion. As a technique therefor, a method has been proposed of carrying out a process of sputtering while the temperature of a wafer is kept high. According to this method, since the surface of the wafer is heated, Al atoms deposited on the wafer can be easily moved on the surface thereof after the deposition process is completed, and as a result, the step coverage of the layer at the step portion can be improved. However, if the temperature of the wafer is too high, another problem arises as follows.

When the temperature of the wafer is raised to a predetermined temperature and sputtering is effected, an admixture contained in the Al-based alloy, e.g., atoms of Si, Cu, and the like, precipitates in the vicinity of the interface between the Al wiring layer and the layer thereunder, e.g., a semiconductor layer, to such an extent that this precipitated admixture cannot be completely removed in a later process. Accordingly, this causes difficulties in, for example, a patterning of the Al wiring layer at the later stage, because it is technically difficult to remove both an unnecessary Al metal portion and the precipitated admixture such as Si, even if the patterning process is carried out by dry etching.

Also, as another technique of heating a wafer to form a wiring layer, a method is known in which a bias voltage of −500 to −1000 volts is applied to the wafer. According to this method, however, since the force of impact of Ar atoms incident on the wafer is very strong, Al atoms once deposited on the wafer are resputtered therefrom, and the resputtered Al atoms are deposited again. As a result, a drawback arises in that "roughness" occurs on the surface of the Al wiring layer and a white turbidity appears thereon, resulting in a deterioration in the quality of the layer.

SUMMARY OF THE INVENTION

An object of the present invention is to provide a metal layer forming method which can realize a good step coverage at a step portion and make the surface of an Al alloy layer substantially flat, while preventing a deterioration in the quality of the layer and facilitating patterning based on a subsequent dry etching process.

Another object of the present invention is to provide a semiconductor device formed by using the metal layer forming method of the present invention.

According to one aspect of the present invention, there is provided a method for forming a metal layer by depositing aluminum-based alloy on a wafer by sputtering, the method comprising the steps of: forming an insulation layer having at least one step portion on the wafer; and forming the metal layer by depositing the aluminum-based alloy over the insulation layer while the wafer is heated to a temperature higher than a predetermined temperature.

Also, according to another aspect of the present invention, there is provided a semiconductor device comprising: a semiconductor wafer; an insulation layer formed on the wafer and having at least one step portion; and a metal layer formed over the insulation layer including the step portion, the metal layer being formed by depositing aluminum-based alloy over the insulation layer by sputtering while the wafer is heated to a temperature higher than a predetermined temperature.

BRIEF DESCRIPTION OF THE DRAWINGS

Other objects and features of the present invention will be described hereinafter in detail by way of a preferred embodiment with reference to the accompanying drawings, in which.

DESCRIPTION OF THE PREFERRED EMBODIMENTS

For a better understanding of the preferred embodiment, the problem in the conventional art will now be explained with reference to FIGS. 1 to 3.

Figure 1:
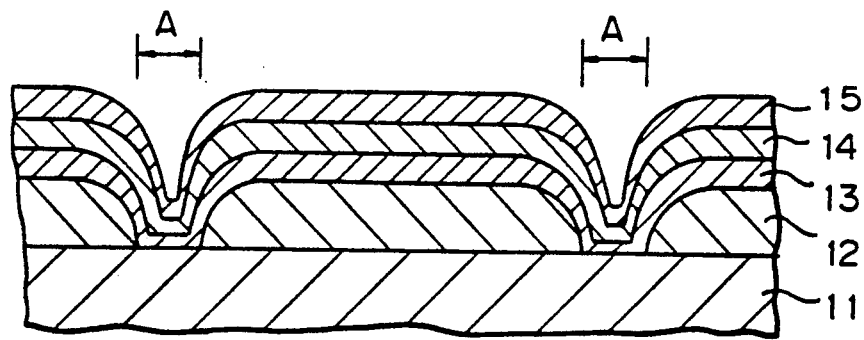
FIG. 1 is a sectional view illustrating an example of the step coverage in the construction of a typical Al multiple-layer wiring.

FIG. 1 shows a sectional view of an example of the step coverage in the construction of a typical Al multiple-layer wiring. The construction is formed by sequentially depositing, on a semiconductor layer or substrate 11, a first insulation layer 12 of silicon dioxide ($SiO_2$), a first wiring layer 13 of Al, a second insulation layer 14 of phosphosilicate glass (PSG), and a second wiring layer 15 of Al.

As shown in FIG. 1, in the contact holes, represented by reference A, at which the first Al wiring layer 13 and the semiconductor layer 11 are electrically connected to each other, the coverage of the second Al wiring layer 15 is relatively poor. Namely, the connection of the second Al wiring layer 15 is very unsatisfactory because of the thinness of the layer 15 at the portions adjacent to the contact holes, i.e., the thin portion of the layer 15 is easily broken due to a migration of Al atoms over a long period of time, and thus the operational reliability of an LSI device is reduced.

As a technique for coping with this drawback, a method is recommended in which the sputtering process is carried out while the temperature of a wafer is kept high. The effect obtained by sputtering with heating will be described hereinafter with reference to FIGS. 2A and 2B.

Figure 2A:
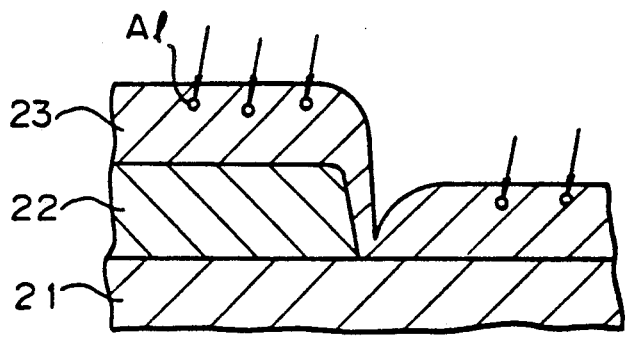
FIGS. 2A and 2B are sectional views illustrating examples of the step coverage for explaining an effect caused by sputtering with heating.

FIG. 2A shows a sectional view of an example of the step coverage when heating is not carried out. In FIG. 2A, reference 21 denotes a semiconductor layer or substrate; reference 22 denotes an insulation layer of, e.g., $SiO_2$; and reference 23 denotes an Al wiring layer. The construction shown in FIG. 2A is part of a device formed on a wafer (not shown). As shown in FIG. 2A, where the heating is not applied to the wafer, little movement of the Al atoms deposited on the wafer occurs, and accordingly, the Al atoms remain in the positions at which they are deposited. As a result, the step coverage at the step portion becomes relatively poor.

Figure 2B:
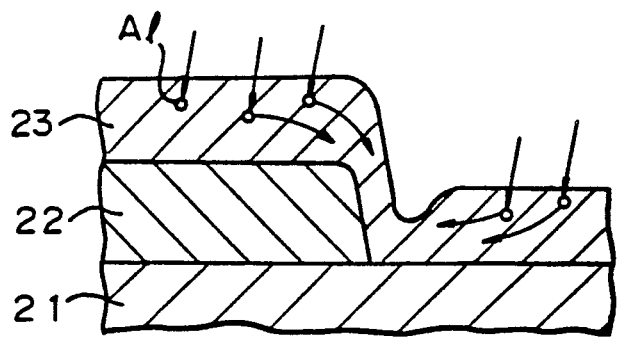

Conversely, referring to FIG. 2B which shows a sectional view of an example of the step coverage where the temperature of a heater (not shown) for heating the wafer is set at approximately 200° C., the shape of the Al wiring layer 23 at the step portion is improved. That is, when heating is applied to the wafer, Al atoms deposited on the wafer can be easily moved toward the step portion, as shown by arrow marks, and accordingly, collected in the step portion. As a result, the step coverage at the step portion becomes better than that of FIG. 2A.

Note, when the sputtering process is carried out while the wafer is heated, an admixture contained in the Al-based alloy, e.g., atoms of Si, Cu, and the like, precipitates in the vicinity of the interface between the Al wiring layer 23 and the semiconductor layer 21. However, the amount of atoms precipitated near the interface at the heater temperature of approximately 200° C. is within a permissible amount, i.e., at which the precipitated atoms of Si, Cu, and the like can be completely removed during a patterning process carried out at a later stage. Therefore, in this case (FIG. 2B), no problem arises with respect to the precipitation of the admixture. The problem caused by the precipitation of the admixture arises when the temperature of the wafer is raised to a temperature higher than a predetermined temperature at which the above amount of precipitation is permissible. This problem will be explained with reference to FIG. 3.

Figure 3:
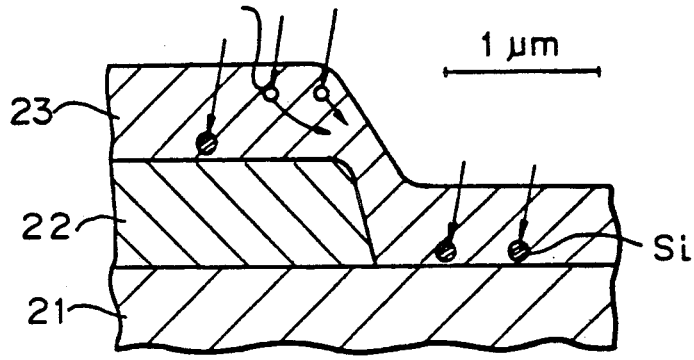
FIG. 3 is a sectional view illustrating an example of the step coverage for explaining a problem in the conventional art.

FIG. 3 shows a sectional view of an example of step coverage when the temperature of the heater is set at approximately 400° C. When the sputtering process is carried out in the above state, an admixture of Si contained in the Al alloy precipitates in an amount exceeding the permissible amount, as shown in FIG. 3 in the form of particles indicated by hatched circles. The precipitated atoms of Si cannot be completely removed in the subsequent process, as explained before, and as a result, the precipitated admixture of Si causes a deterioration in the quality of the Al wiring layer, and over a long period of time, exerts an adverse influence upon the function of a semiconductor device including the Al wiring layer.

A preferred embodiment of the present invention will now be described with reference to FIGS. 4 to 6.

Figure 4:
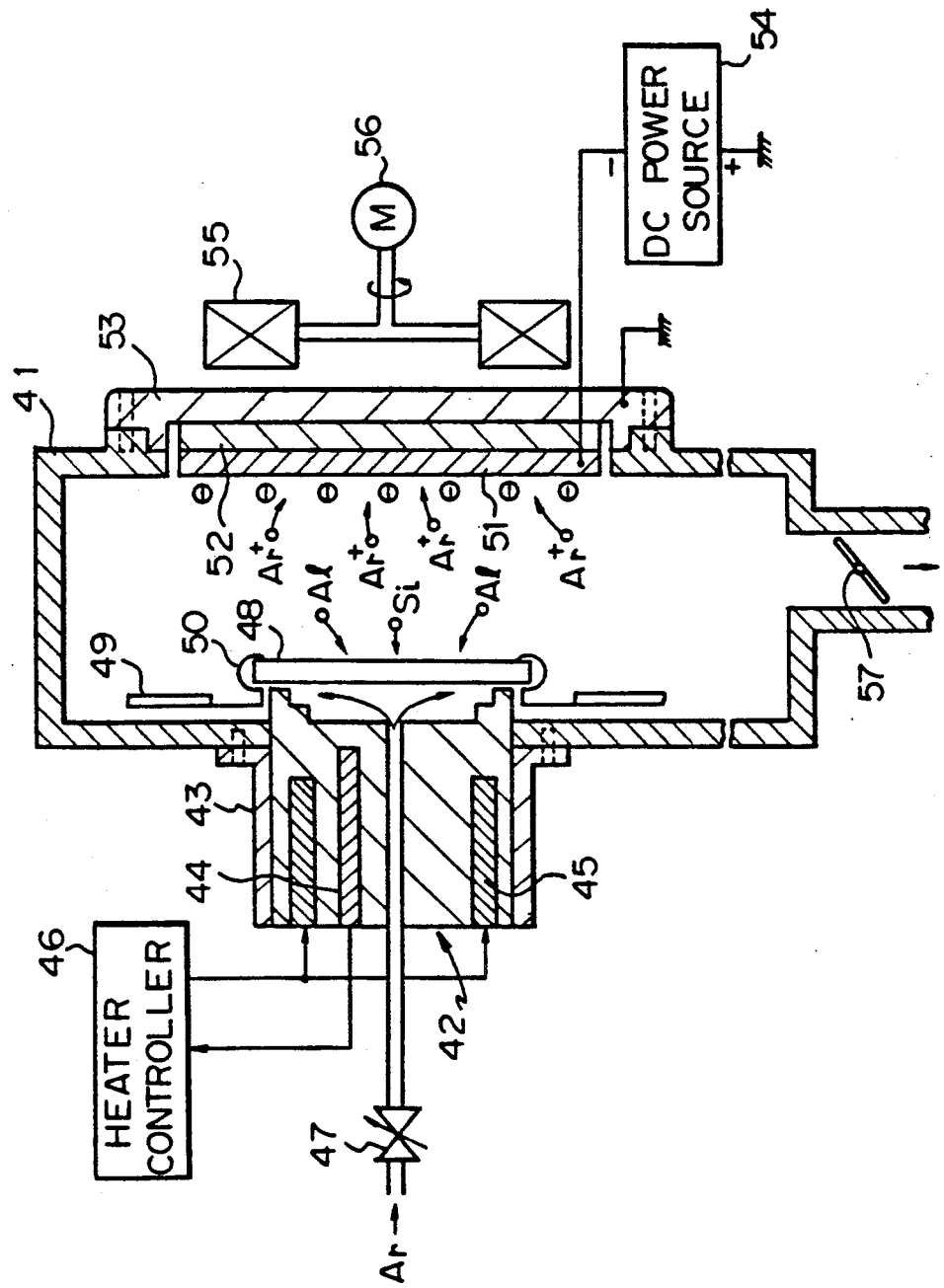
FIG. 4 is a view illustrating a constitution of the sputtering apparatus for implementing the metal layer forming method according to the present invention.

FIG. 4 illustrates the constitution of the sputtering apparatus for implementing the metal layer forming method according to the present invention.

Referring to FIG. 4, reference 41 denotes a vacuum container having an opening at one side, a heater block 42 is held by a block holding member 43 fixed to the container 41 by screws. The heater block 42 is formed of copper, which has a good thermal conductivity, and a thermocouple 44 and eight annularly arranged cartridge type heaters 45 are embedded therein. Reference 46 denotes a heater controller, which regulates the temperatures of each of the cartridge heaters 45 to a constant temperature, in accordance with the temperature of the heater block 42 detected by the thermocouple 44. In the present example, the constant temperature is set at 600° C. The heater block 42 has a through hole in the central portion thereof, and argon (Ar) gas supplied from an external source is introduced, via a flow regulating valve 47, through the through hole of the block 42 into the vacuum container 41.

Reference 48 denotes a semiconductor wafer, which is held by a pair of holding members 50 mounted on a corresponding tray 49 and arranged at a predetermined position, i.e., opposite to the end face, of the heater block 42, from which Ar gas is delivered. The positioning of the wafer 48 is performed by a carrying system (not shown). A target 51 consisting of binary alloy of Al-1% Si is provided in an opening at the side of the vacuum container opposite to the wafer 48. The target 51 is held via an insulation member 52 by a target holding member 53, which is fixed to the vacuum container 41 by screws, and as a result, the opening is sealed. Also, the target 51 is connected to a direct current (DC) power source 54 having a voltage of −400 to −500 V, a current of 15 to 20 A, and a power of 7 to 10 kW, and the holding member 53 is grounded commonly with the vacuum container 41.

Reference 55 denotes a magnet, which forms an annular magnetic field area for confining electrons in the vicinity of the surface of the target 51. Reference 56 denotes a motor for rotating the magnet 55 so that the magnitude of the magnetic field is made uniform over the whole surface of the target. The operation of the magnet 55 causes the surface of the target 51 to be biased to a high negative potential and, accordingly, a high density plasma state is realized, resulting in an improvement in the speed of the forming of a layer. Reference 57 denotes a conductance regulating valve, which regulates the gas pressure within the vacuum container 41 to a predetermined value. Gas within the container is evacuated with a cryopump (not shown) through the valve 57.

The sputtering apparatus shown in FIG. 4 is not the feature the present invention, and therefore a detailed explanation of the operation thereof will be omitted. The wafer 48 is heated by the heater block 42, i.e., heated by thermal contact with the Ar gas introduced via the through hole of the block 42. When the sputtering process is started, the material of the target 51, i.e., Al-1% Si, is deposited on the wafer 48 by the sputtering, and the temperature of the wafer then rises. The rise of the temperature of the wafer 48 depends upon both the temperature produced by the heat from the heater block 42 and that produced by the heat due to the deposition of atoms. When the heater temperature is set at approximately 600° C., the measured values of the temperature of the wafer 48 are indicated in the following table.

TABLE

| | CONDITIONS | TEMPERATURE OF WAFER |
|---|---|---|
| CASE-1 | heater, 600° C. Ar gas (absent) | (after a lapse of 30 seconds, 135° C.) (after a lapse of 60 seconds, 220° C.) 380° C. |
| CASE-2 | heater, 600° C. Ar gas, 18 SCCM (18 cc upon conversion to atmospheric pressure) | (after a lapse of 30 seconds, 345° C.) (after a lapse of 60 seconds, 440° C.) 460° C. |
| CASE-3 | heater, 600° C. Ar gas, 18 SCCM deposition, 1.5 minutes, 7 kW pre-heating (absent) | 530° C. |
| CASE-4 | heater, 600° C. Ar gas, 18 SCCM deposition, 1.5 minutes, 7 kW pre-heating, 2 minutes | 570° C. |

Figure 5:
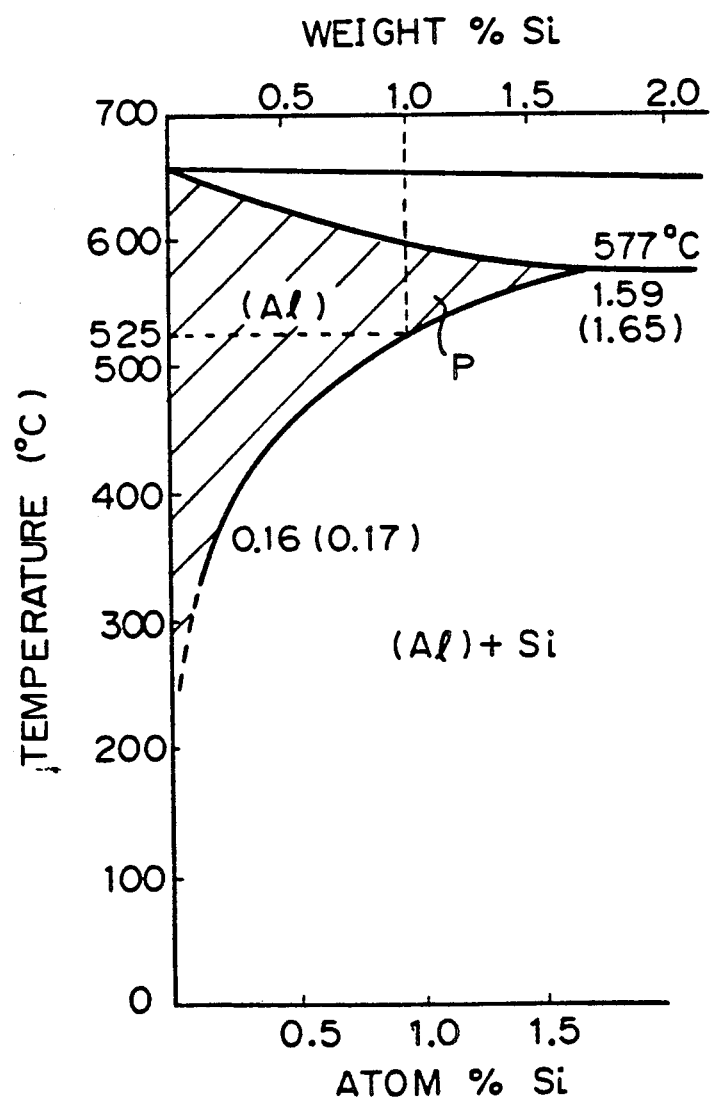
FIG. 5 is a graph illustrating an equilibrium diagram of the binary alloy (Al-Si)

FIG. 5 is a graph illustrating an equilibrium diagram of the binary alloy (Al-Si) with respect to the temperature. In FIG. 5, the hatched region indicated by reference P represents a solid solution region, in which Si atoms are in the state of a solid solution in the Al matrix. In the region of the lower side of the solid solution region, i.e., the region of the low temperature side, Si atoms precipitate in the Al matrix.

Therefore, in the present example (Al-1% by weight of Si), the state of the Al-Si alloy changes at approximately 525° C. That is, an admixture of Si is deposited in the Al solid at a temperature lower than 525° C., but it is brought to the state of an absolutely solid solution in the Al solid at a temperature higher than 525° C.

Referring to the above Table and the graph in FIG. 5, in the present embodiment, the temperature of the wafer during the sputtering process rises from the time when the sputtering is started, i.e., the state (460° C.) in CASE-2 to the state (570° C.) in CASE-4. Therefore, Si atoms in the films deposited on the wafer are brought to the state of an absolutely solid solution in the Al solid.

Figure 6:
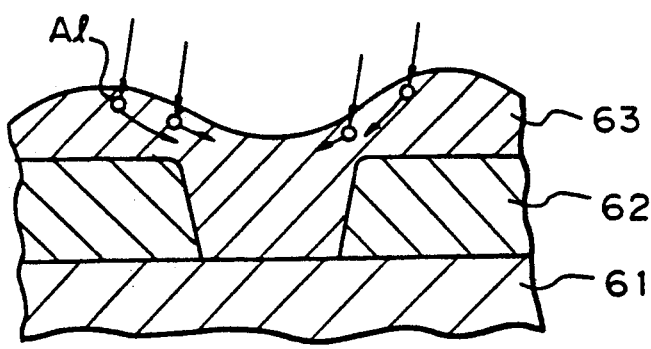
FIG. 6 is a sectional view illustrating an example of the step coverage for explaining an effect obtained by a sputtering process using the apparatus shown in FIG. 4.

FIG. 6 illustrates an example of the step coverage obtained when Si atoms are brought to the state of a solid solution. Comparing the sectional view at the heater temperature of approximately 600° C. in FIG. 6 with that at the heater temperature of approximately 400° C. in FIG. 3, representing a conventional example, it will be appreciated that the shape of the Al wiring layer 63 at the step portion in FIG. 6 is flatter than the corresponding shape in FIG. 3 although the former is a little different from the latter, and that an admixture of Si does not precipitate in the form of coarse particles in the vicinity of the interface between the Al wiring layer 63 and the semiconductor layer 61, because a re-dissolution and quick freezing of the admixture of Si are effected in the Al solid in a solid-phase state.

As explained above, by heating the wafer to a temperature higher than the temperature at which solid solution is formed in the Al alloy, i.e., 525° C. in the present example, to form an Al wiring layer, the shape of the layer at the step portion can be planarized, and since the admixture does not precipitate in the form of coarse particles in the vicinity of the interface, a patterning process based on a subsequent dry etching can be facilitated. Also, the surface of the Al wiring layer formed at the step portion is relatively smooth. Furthermore, the Al wiring layer is stable with respect to a subsequent heating process at 450° C. to 500° C. and thus a deterioration in the quality of the layer can be prevented.

Although the present invention has been disclosed and described by way of only one embodiment, it is apparent to those skilled in the art that other embodiments and modifications of the present invention ar possible without departing from the spirit or essential features thereof.

What is claimed is:

1. A method for forming a metal layer by depositing aluminum-based alloy on a wafer by sputtering, said method comprising the steps of:
    (a) forming an insulation layer having at least one step portion on the wafer;
    (b) forming the metal layer by sputter depositing the aluminum-based alloy including an impurity containing admixture over the insulation layer while heating the wafer to a temperature higher than a predetermined temperature at which a solid solution including aluminum and aluminum-based alloy is formed in the aluminum-based alloy; and
    (c) freezing the wafer at a rate such that the impurity containing admixture does not precipitate.

2. A method as set forth in claim 1, wherein the predetermined temperature in said step b) is set to a lower limit of a temperature range sufficient for forming the solid solution in the aluminum-based alloy.

3. A method as set forth in claim 2, wherein the lower limit value is approximately 525° C., and wherein the aluminum-based alloy in said step b) is a binary alloy containing 1 percent by weight of silicon.

4. A method as set forth in claim 3, wherein said step b) comprises the substep of heating the wafer to at least 525° C. by heat produced from a heating means and heat generated due to a deposition of aluminum atoms on the wafer.

* * * * *

UNITED STATES PATENT AND TRADEMARK OFFICE
CERTIFICATE OF CORRECTION

PATENT NO. : 5,071,791

DATED : December 10, 1991

INVENTOR(S) : Minoru Inoue, et. al.

It is certified that error appears in the above-identified patent and that said Letters Patent is hereby corrected as shown below:

```
Col. 1, line 24, "in" should be deleted.
Col. 6, line 34, "ar" should be --are--.
```

Signed and Sealed this

Twenty-fifth Day of May, 1993

Attest:

MICHAEL K. KIRK

Attesting Officer

Acting Commissioner of Patents and Trademarks